(12) United States Patent
Chang et al.

(10) Patent No.: US 6,624,030 B2
(45) Date of Patent: Sep. 23, 2003

(54) METHOD OF FABRICATING POWER RECTIFIER DEVICE HAVING A LATERALLY GRADED P-N JUNCTION FOR A CHANNEL REGION

(75) Inventors: Paul Chang, Saratoga, CA (US); Geeng-Chuan Chern, Cupertino, CA (US); Wayne Y. W. Hsueh, San Jose, CA (US); Vladimir Rodov, Redondo Beach, CA (US); Charles Lin, Fremont, CA (US)

(73) Assignee: Advanced Power Devices, Inc., San Jose, CA (US)

( * ) Notice: Subject to any disclaimer, the term of this patent is extended or adjusted under 35 U.S.C. 154(b) by 0 days.

(21) Appl. No.: 09/742,262

(22) Filed: Dec. 19, 2000

(65) Prior Publication Data

US 2002/0074595 A1 Jun. 20, 2002

(51) Int. Cl.$^7$ .................................. H01L 21/336
(52) U.S. Cl. ........................ 438/268; 438/531
(58) Field of Search .................. 438/269–274, 438/531, 268

(56) References Cited

U.S. PATENT DOCUMENTS

| | | | |
|---|---|---|---|
| 3,603,811 A | 9/1971 | Day | |
| 4,417,385 A | * 11/1983 | Temple | 257/341 |
| 4,598,461 A | * 7/1986 | Love | 257/341 |
| 4,920,062 A | * 4/1990 | Tsunoda | 148/DIG. 126 |
| 4,982,260 A | 1/1991 | Chang et al. | |
| 5,023,191 A | * 6/1991 | Sakurai | 148/DIG. 82 |
| 5,430,315 A | 7/1995 | Rumennik | |
| 5,578,510 A | * 11/1996 | Tani | 438/400 |
| 5,629,536 A | 5/1997 | Heminger et al. | |
| 5,747,841 A | 5/1998 | Ludikhuize | |
| 5,751,025 A | 5/1998 | Heminger et al. | |
| 5,818,084 A | 10/1998 | Williams et al. | |
| 5,825,079 A | 10/1998 | Metzler et al. | |
| 5,877,515 A | 3/1999 | Ajit | |
| 5,933,733 A | * 8/1999 | Ferla et al. | 438/138 |
| 5,956,582 A | 9/1999 | Ayela et al. | |
| 6,017,785 A | * 1/2000 | Han et al. | 438/199 |
| 6,020,244 A | * 2/2000 | Thompson et al. | 438/302 |
| 6,034,385 A | 3/2000 | Stephani et al. | |
| 6,051,468 A | * 4/2000 | Hshieh | 438/270 |
| 6,097,046 A | 8/2000 | Plumton | |
| 6,117,735 A | * 9/2000 | Ueno | 438/268 |
| 6,180,464 B1 | * 1/2001 | Krivokapic et al. | 438/289 |
| 6,186,408 B1 | 2/2001 | Rodov et al. | |
| 6,274,443 B1 | * 8/2001 | Yu et al. | 438/299 |

OTHER PUBLICATIONS

Christiansen, Bob, "Synchronous Rectification Improves with Age," PCIM, Aug., 1998, 6 pp.

* cited by examiner

Primary Examiner—John F. Niebling
Assistant Examiner—Angel Roman
(74) Attorney, Agent, or Firm—Beyer Weaver & Thomas, LLP

(57) ABSTRACT

A vertical semiconductor rectifier device includes a semiconductor substrate of first conductivity type and having a plurality of gates insulatively formed on a first major surface and a plurality of source/drain regions of the first conductivity type formed in surface regions of second conductivity type in the first major surface adjacent to the gates. A plurality of channels of the second conductivity type each abuts a source/drain region and extends under a gate, each channel being laterally graded with a sloped P-N junction separating the channel region from the substrate of first conductivity type. In fabricating the vertical semiconductor rectifier device, a partial ion mask is formed on the surface of the semiconductor with the mask having a sloped surface which varies the path length of ions through the mask to form laterally-graded channel regions.

18 Claims, 11 Drawing Sheets

METHOD OF FABRICATING POWER RECTIFIER DEVICE HAVING A LATERALLY GRADED P-N JUNCTION FOR A CHANNEL REGION

CROSS-REFERENCES TO RELATED APPLICATIONS

This application is related to pending application Ser. No. 09/283,537 filed Apr. 1, 1999 for "Power Rectifier Device", the description of which is incorporated herein by reference, and to pending application Ser. No. 09/544,730, filed Apr. 6, 2000 for "Method of Fabricating Power Rectifier Device to Vary Operating Parameters and Resulting Device," the description of which is incorporated by reference.

BACKGROUND OF THE INVENTION

This invention relates generally to power semiconductor devices, and more particularly the invention relates to a power semiconductor rectifier device and a method of making same.

Power semiconductor rectifiers have a variety of applications including use in power supplies and power converters. Heretofore, Schottky diodes have been used in these applications. A Schottky diode is characterized by a low turn-on voltage, fast turnoff, and nonconductance when the diode is reverse biased. However, to create a Schottky diode a metal-silicon barrier must be formed. In order to obtain the proper characteristics for the Schottky diode, the barrier metal is likely different than the metal used in other process steps such as metal Ohmic contacts. Further, Schottky diode rectifiers suffer from problems such as high leakage current and reverse power dissipation. Also, these problems increase with temperature causing reliability problems for power supply applications. Therefore, the design of voltage converters using Schottky barrier diodes can cause designer problems for many applications.

A semiconductor power rectifier device is known which does not employ Schottky barriers. FIG. 1 from U.S. Pat. No. 5,818,084 is a schematic of such a device which comprises a MOSFET transistor shown generally at 10 having a source/drain 12 which is shorted to a gate 14. A parasitic diode 16 is connected from the source/drain 12 to the drain/source 18. The patent discloses the use of a trench for accommodating the gate.

Copending application Ser. No. 09/283,537, supra, discloses a vertical semiconductor power rectifier device which employs a large number of parallel connected cells, each comprising a MOSFET structure with a gate-to-drain short via common metallization. This provides a low $V_f$ path through the channel regions of the MOSFET cells to the source region on the other side of the device. The method of manufacturing the rectifier device provides highly repeatable device characteristics at reduced manufacturing costs. The active channel regions of the device are defined using pedestals in a double spacer, double implant self-aligned process. The channel dimensions and doping characteristics may be precisely controlled despite inevitable process variations and spatial sidewall formation.

Copending application Ser. No. 09/544,730, supra, discloses an improved method of manufacturing a semiconductor power rectifier device and the resulting structure. As shown in the section view of FIG. 2 the semiconductor substrate 20 and epitaxial layer 22 functions as one source/drain (e.g. the drain) of the device and a plurality of second source/drain (e.g. source) regions 24 are formed on a major surface of the substrate along with a plurality of gate electrodes with the source/drain and gate electrodes 26 positioned within a guard ring 28 and, optionally, conductive plugs 30 in the major surface. A conductive layer 32 contacts source/drain regions 24 and gate electrodes 26, and conductive layer 34 contacts substrate 20.

The semiconductive rectifier device is fabricated using conventional semiconductor processing steps including photoresist masking, plasma etching, and ion implantation in forming the guard ring, conductive plugs, source/drain regions, and gate electrodes overlying device channel regions. In accordance with one feature of the disclosed process, a photoresist mask used in defining the gate oxide and gate of the device is isotropically or otherwise etched to expose peripheral portions of the gate electrode through which ions are implanted to create channel regions in body regions under and controlled by the gate electrode. FIG. 3 is a plan view of the device showing the boundary of substrate 20, guard ring 28, optional plugs 30, and source/drains 24 in unit cells, and top electrode 32. The P-N junction 36 between the channel region and epitaxial layer 22 of the bottom source/drain is defined by a shallow uniform Boron implant which forms p-region 38.

SUMMARY OF THE INVENTION

The present invention is an improvement to the process and device of copending application Ser. No. 09/544,730. In particular, the P-N junction between each channel and the underlying source/drain region has a gradual slope and is less abrupt under each gate electrode as compared to the device in the copending application. This allows a more vertical flow of current from the top source/drain regions to the underlying substrate source/drain region which increases current flow at a lower turn-on voltage.

In fabricating the device, isotropic etching is used to form a sloped ion implant mask through which ions are implanted to form a laterally graded P-N junction for a channel region. The gate electrode for a unit cell overlaps the laterally graded P-N junction in the finished device.

Unlike the earlier methods which rely on spacers for allowing accurately separate dopant implant concentrations under the gate to control channel length, spacers are not required in the present invention. The invention allows a significant increase in device packing density since no space is needed between pedestals for spacers, and tighter control of dopant peak separation is realized using the sloped ion implant mask. Thus, shorter channels can be fabricated, from approximately 0.25 micron to 0.1 micron.

The invention and objects and features thereof will be more readily apparent from the following detailed description and appended claims when taken with the drawings.

DETAILED DESCRIPTION OF THE ILLUSTRATIVE EMBODIMENTS

Figure 4:
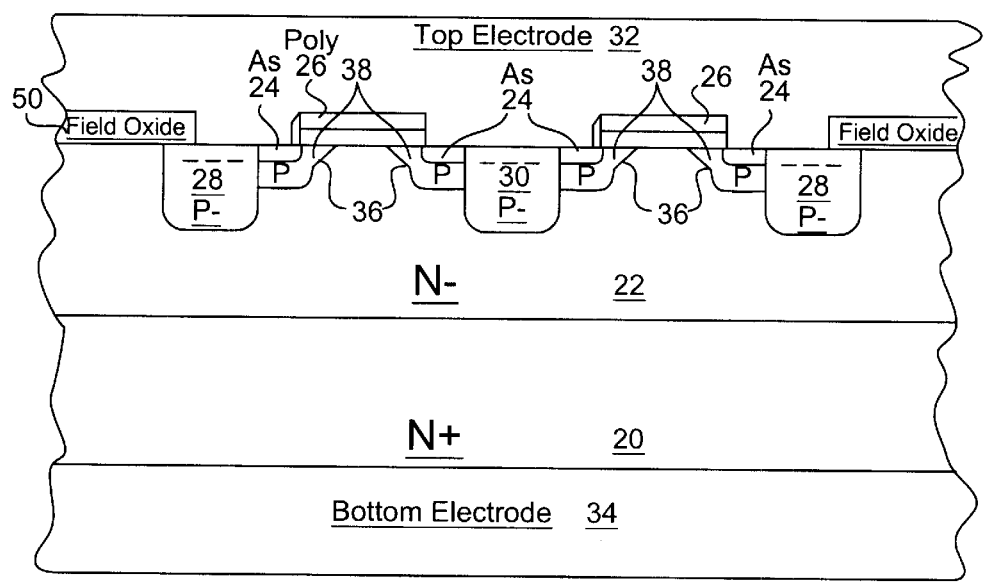
FIG. 4 is a section view of a power rectified device in accordance with one embodiment of the present invention.

FIG. 4 is a section view of a power rectifier device in accordance with one embodiment of the present invention.

Figure 1:
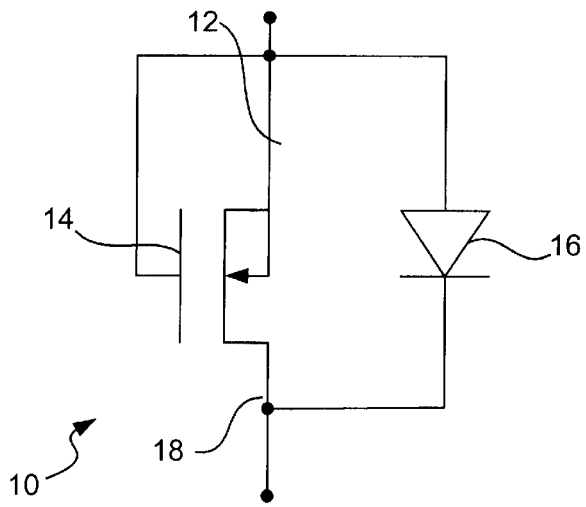
FIG. 1 is an electrical schematic of a power rectifier device to which the invention applies.
Figure 2:
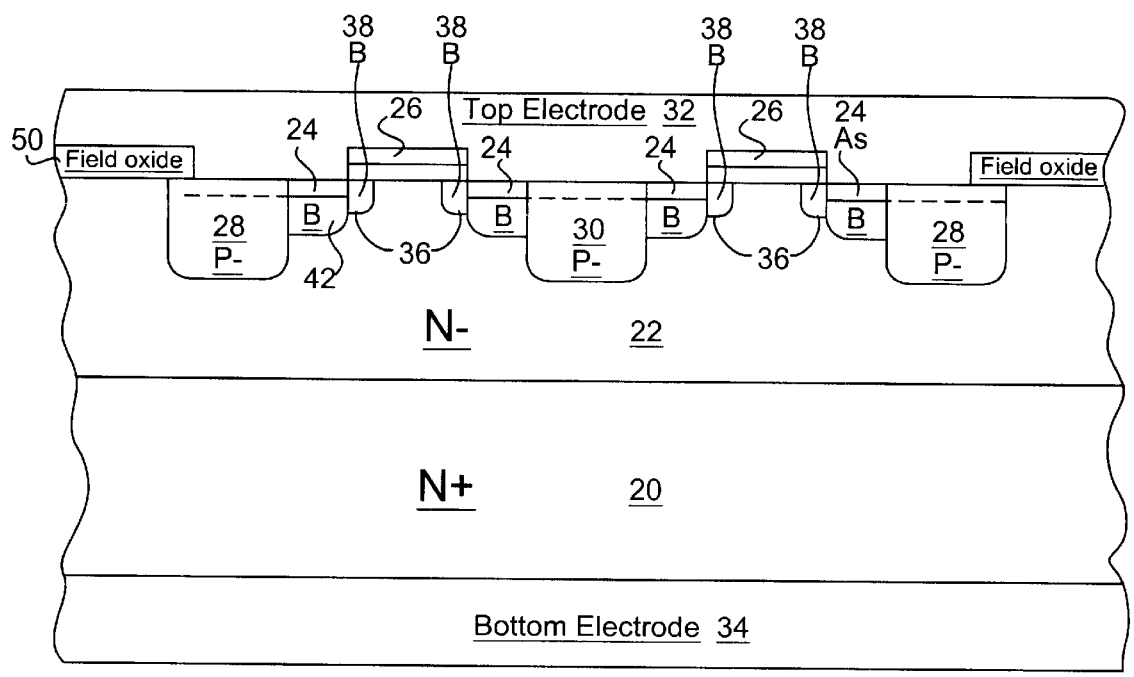
FIG. 2 are section view of a power rectifier device in accordance with copending application Ser. No. 09/544,730.
Figure 3:
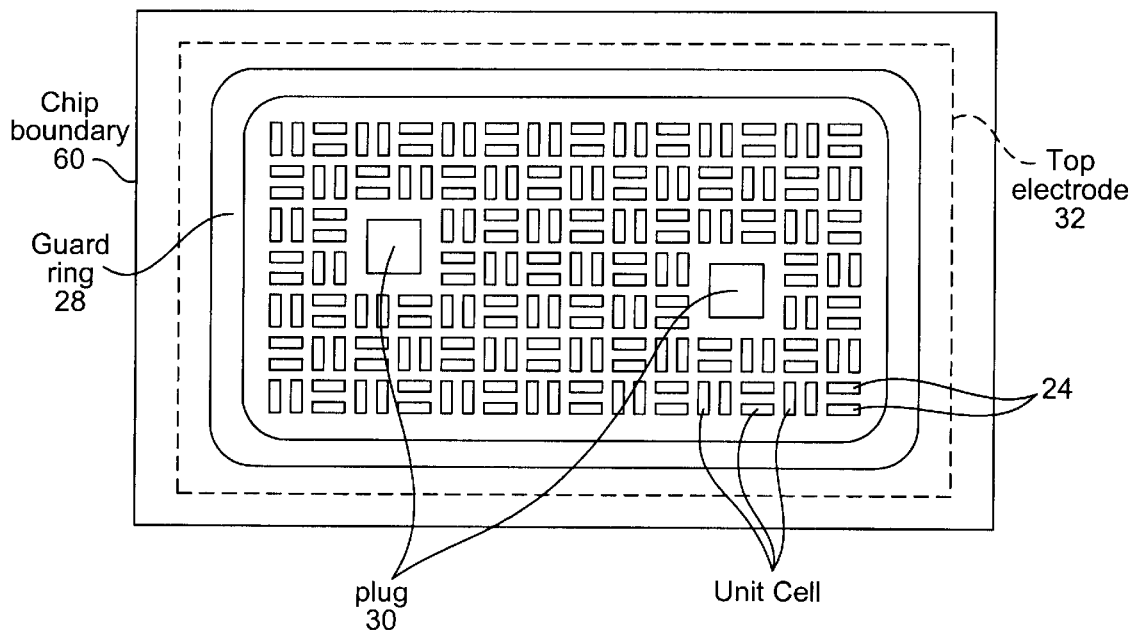
FIG. 3 is a plan view of the power rectifier device of FIG. 2.

The device is similar to the structure illustrated in FIG. 2, and like elements in the drawings have the same reference numerals. Again, bottom electrode 34 contacts N+ substrate 20 and N– epitaxial layer 22 which comprise one source/drain of the device. Arsenic doped N+ regions 24 comprise source/drains of the device which are connected through a channel 38 to epitaxial layer 22 and the bottom source/drain region under control bias voltage on gate electrodes 26. An important feature of the present invention is the provision of a laterally-graded P-N junction 36 between P-doped channel region 38 and N-doped epitaxial layer 22. As will be described hereinbelow, the graded P-N junction is formed by implanting Boron dopant into the channel region through a sloped polysilicon mask as opposed to the uniform implantation of dopants into regions 38 of FIG. 2. The laterally graded P-N junction for the channel region permits a lower threshold voltage for the junction, as well as increased current flow from the top electrode 32 to the bottom electrode 34.

Figure 5:
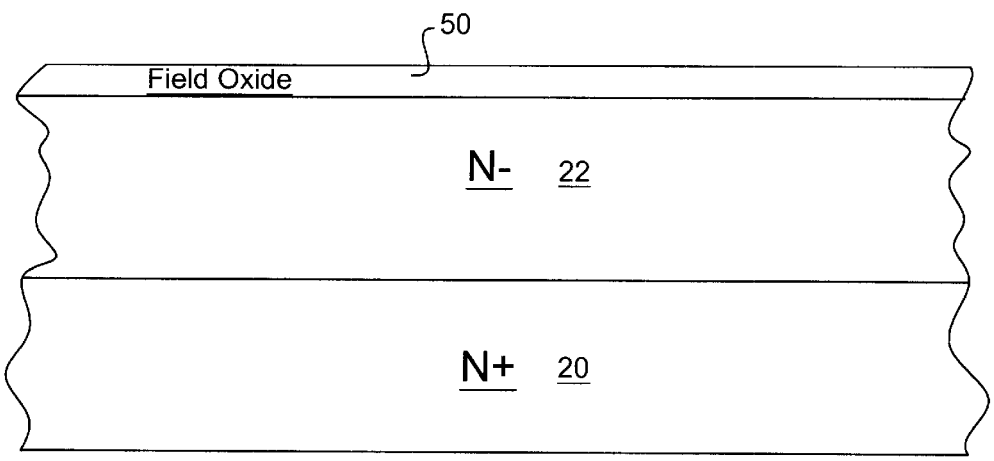
FIGS. 5–17 are section views illustrating steps in fabricating the device of FIG. 4.
Figure 6:
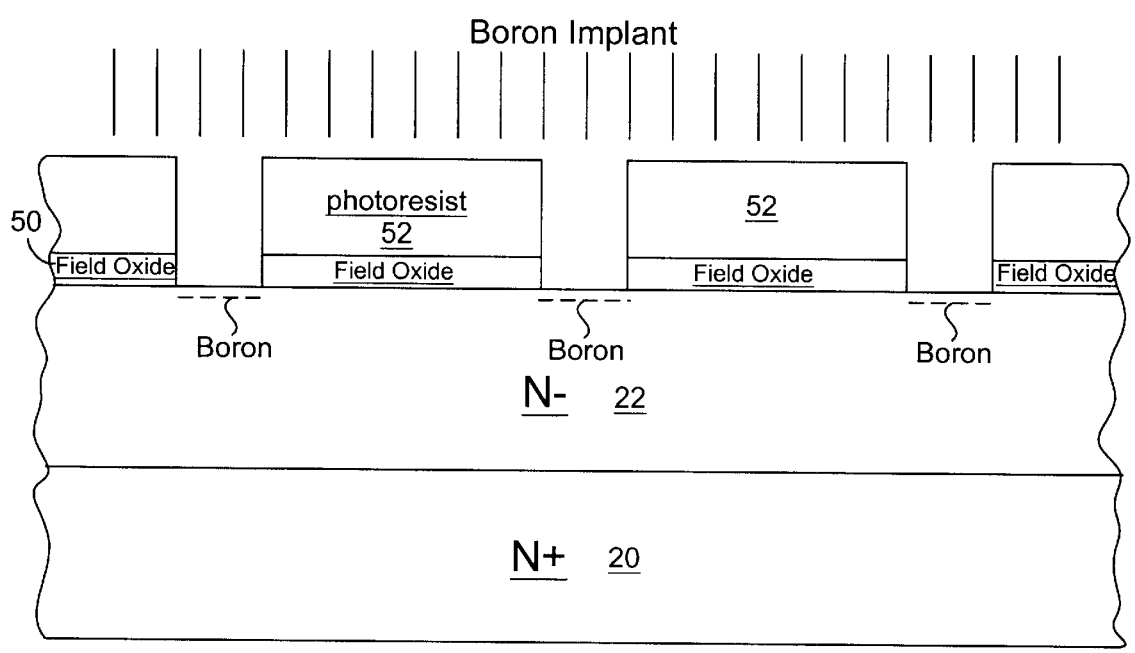
Figure 7:
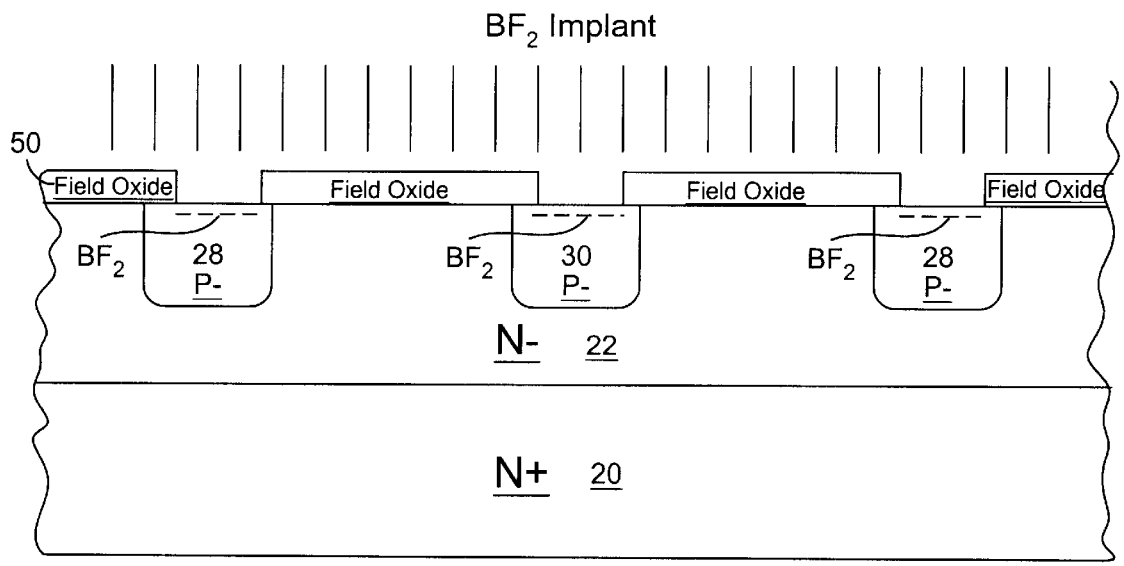

FIGS. 5–17 are section views illustrating steps in fabricating the device of FIG. 4. In FIG. 5, a semiconductor body is provided including N+ substrate 20 on which is formed N– epitaxial layer 22 having a resistivity on the order of 0.1–10 ohm cm. Field oxide 50 is grown or deposited on the surface of layer 22 to a thickness of 300–1000 nm. Thereafter, as shown in FIG. 6, a photoresist pattern 52 is selectively formed over field oxide 50 by photoresist masking and etching techniques, and a P-type dopant such as Boron is then implanted through openings in the photoresist. The Boron can be implanted before or after photoresist removal, and as shown in FIG. 7 a Boron thermal drive-in forms deep P-regions including an annular guard ring 28 which defines a device region in layer 22 and, optionally, one or more P-doped conductive plugs 30 within the device region. Plugs 30 are not essential in the device, especially for small area rectifier devices in which the guard ring alone will suffice in forming a diode with layer 22. Dopant concentration of the P-doped regions is on the order of $E11-E14/cm^2$. A second $BF_2$ implant is then made in the surface of the P-doped regions for high surface concentration ($E12-E15/cm^2$) to form good ohmic contacts, and then the $BF_2$ is activated by rapid thermal annealing.

Figure 8:
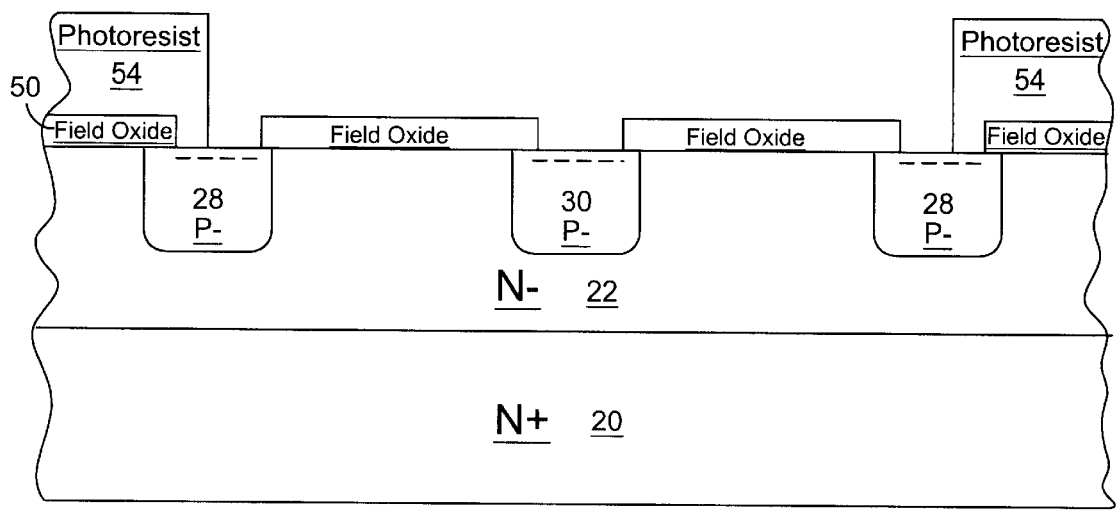
Figure 9:
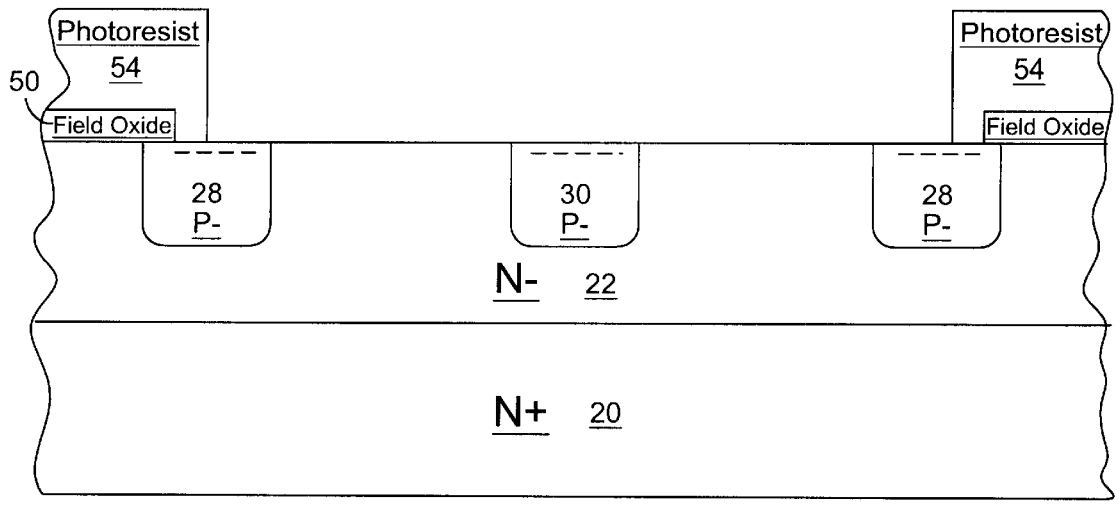
Figure 10:
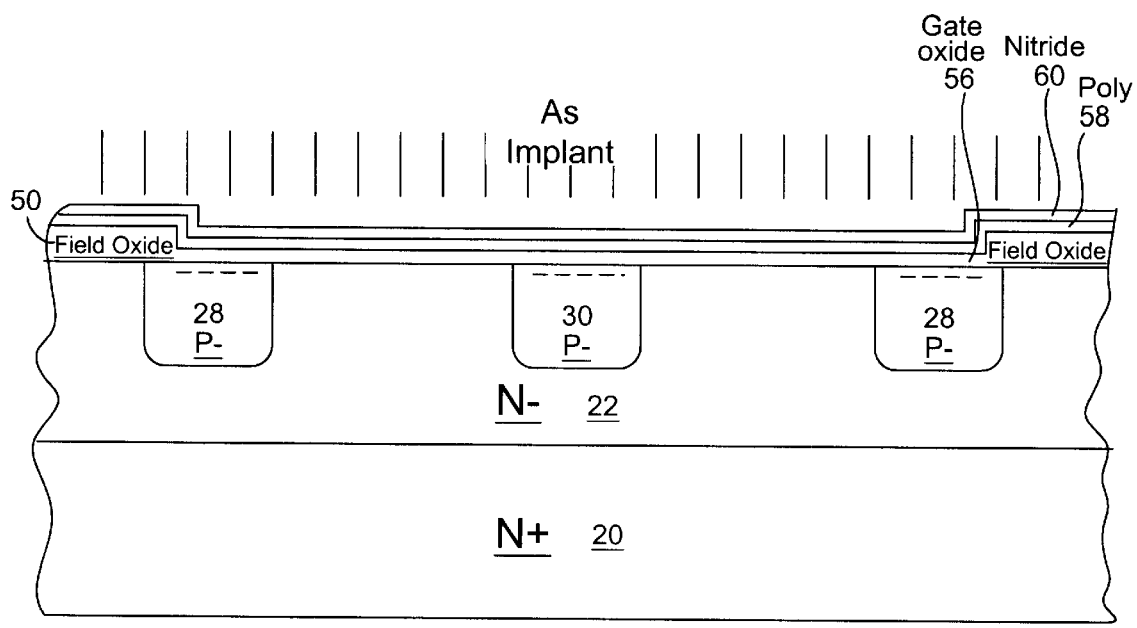
Figure 16:
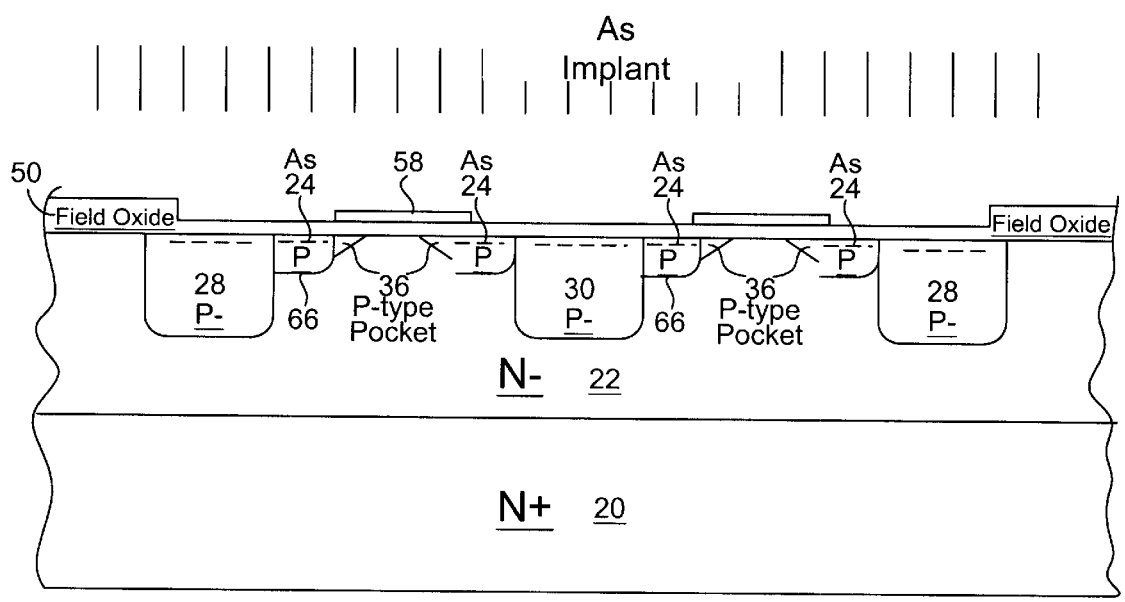
Figure 17:
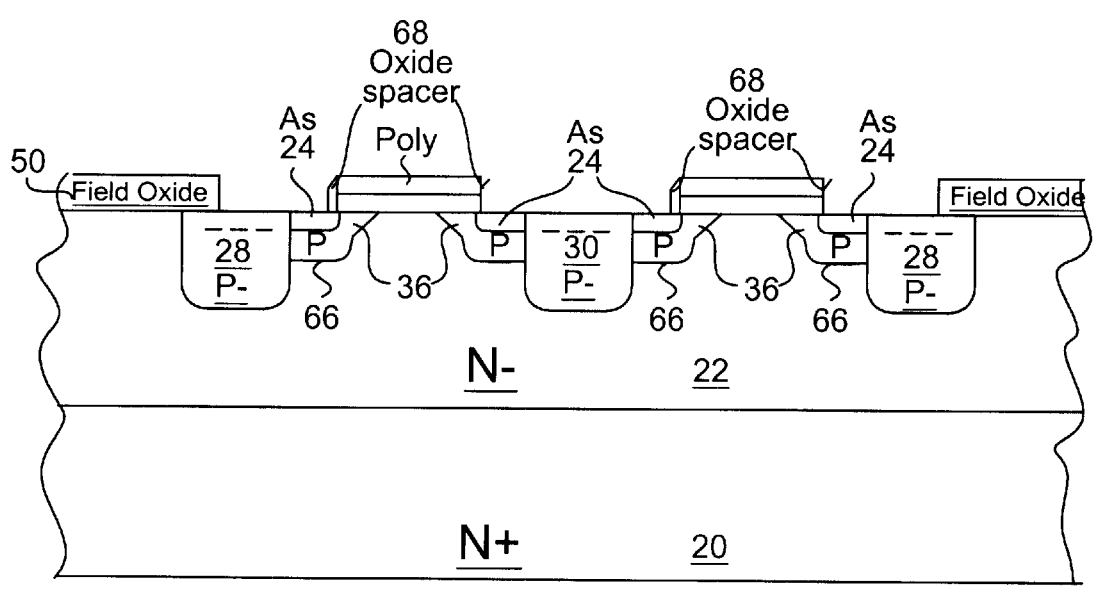

Next as shown in FIG. 8, a photoresist pattern 54 is developed to cover the area outside of the device region, and then the field oxide 50 in the device region is removed by etching as shown in FIG. 9. Thereafter, as shown in FIG. 10, photoresist 54 is removed, and a gate silicon oxide layer 56 of 5–50 nm is grown. A doped or undoped polysilicon layer 58 of 10–80 nm thickness is then deposited over gate oxide 56. An arsenic implant can be made now or at a later step as shown in FIG. 16, infra. Thereafter, an insulator layer 60 such as silicon nitride is formed over polysilicon layer 58.

Figure 11A:
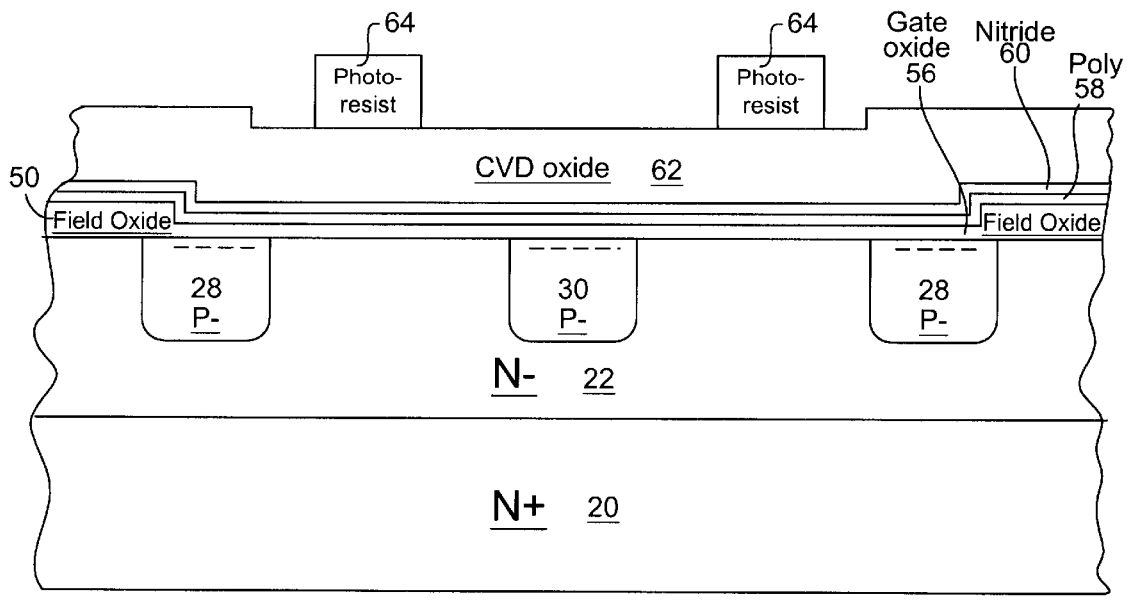
Figure 11B:
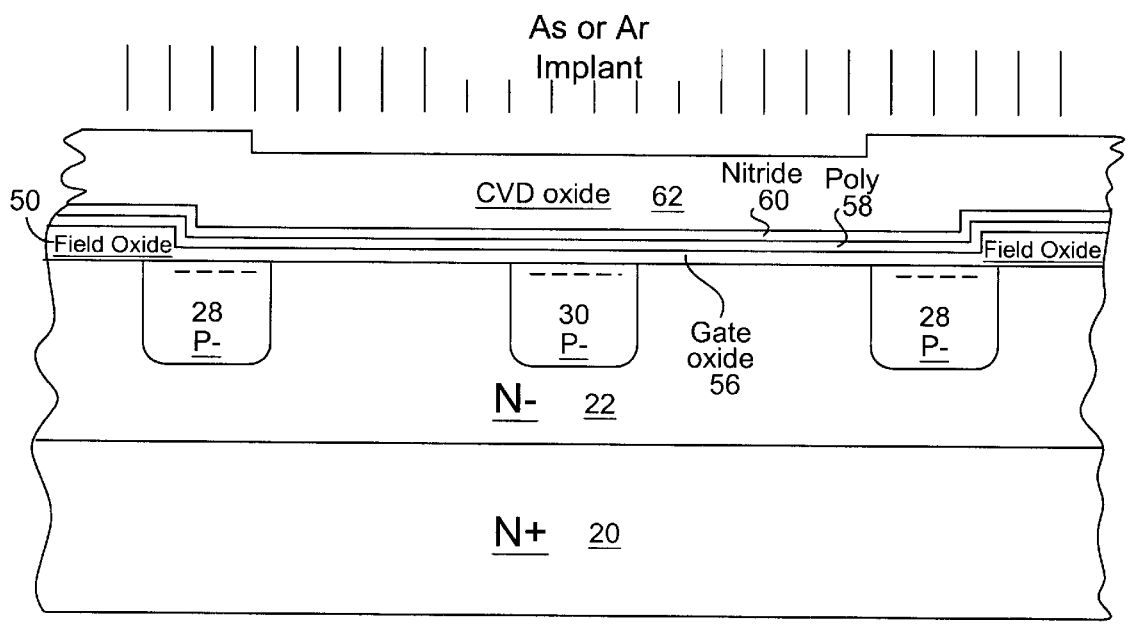

As shown in FIG. 11A, 200–400 nm of silicon oxide 62 is then formed by chemical vapor deposition, and then a photoresist pattern 64 is formed over layer 62. Alternatively, as shown in FIG. 11B, arsenic or AR implant (dose=0.2–5.0 E16/cm; energy=60–150 KeV) causes surface damages so that the oxide etch rate near the top surface of layer 62 is faster than near the bottom. Thereafter, the photoresist pattern 64 as shown in FIG. 11A is formed.

Figure 12A:
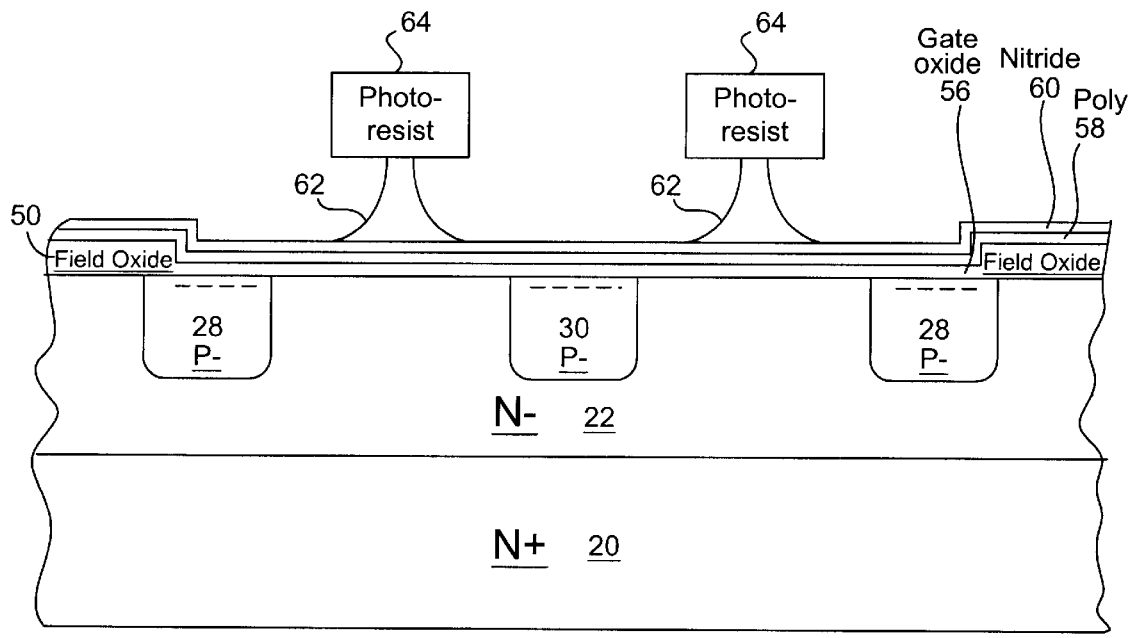
Figure 12B:
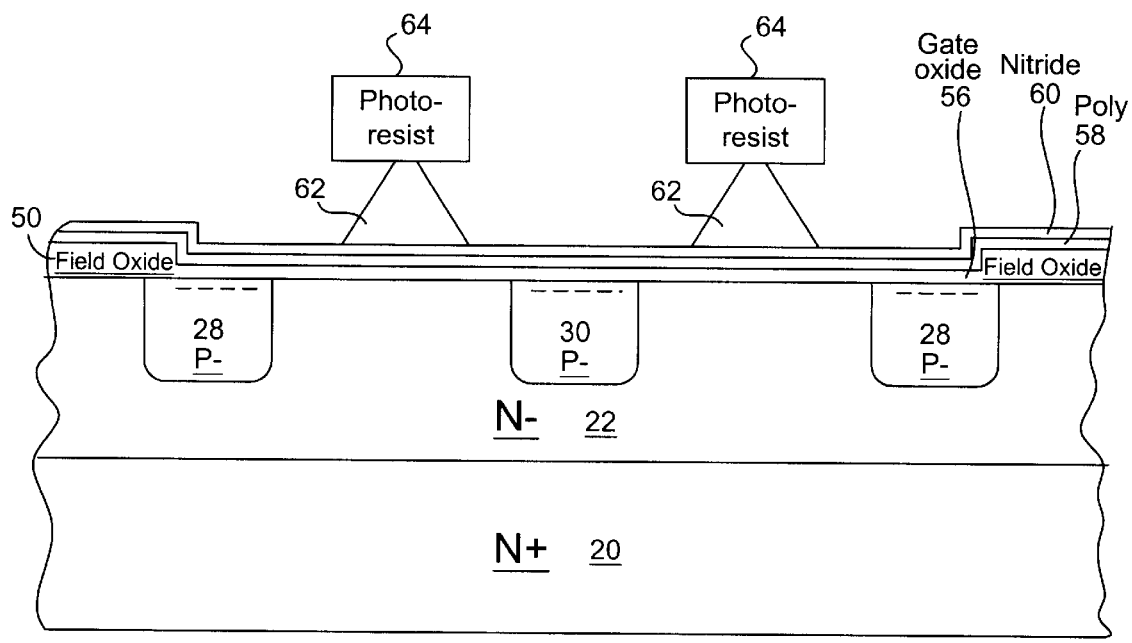
Figure 13A:
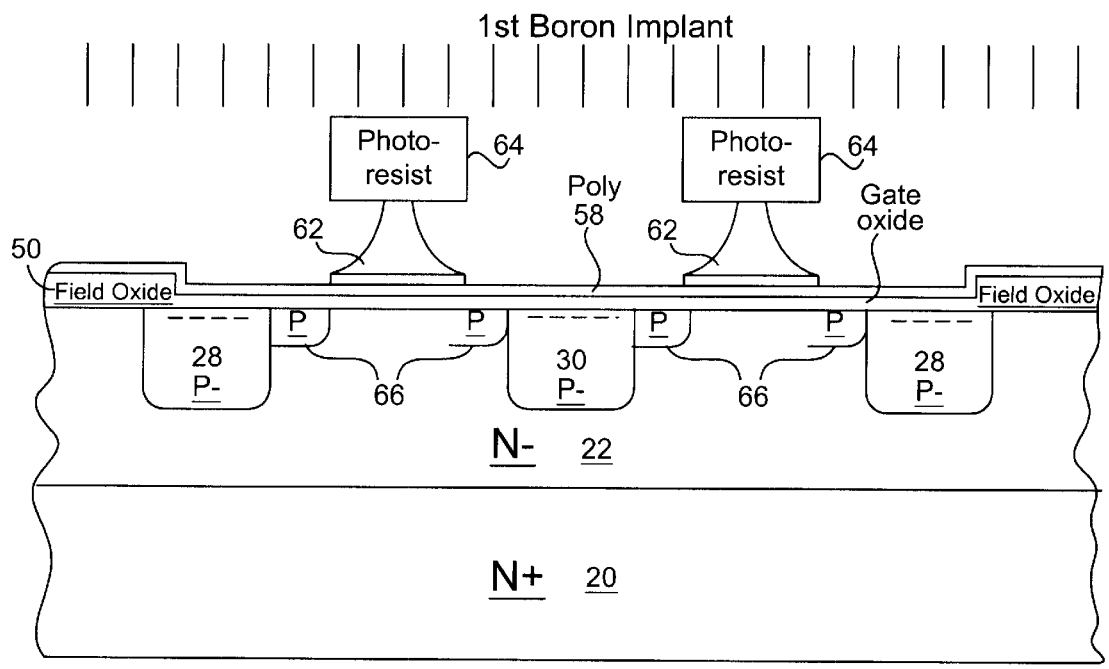
Figure 13B:
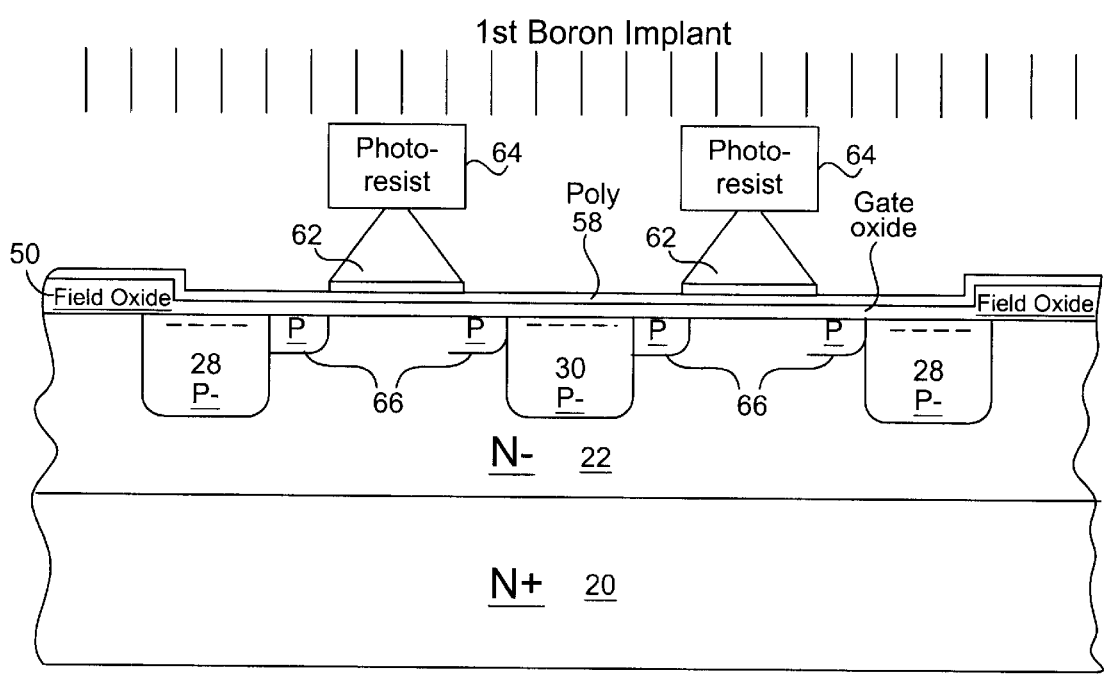

Next, the oxide layer 62 is isotopically etched to nitride layer 60 as shown in FIG. 12A, thus leaving only the oxide layer 62 under photoresist pattern 64 with the oxide layer having sloped surfaces as indicated. Alternatively, using the process modification of FIG. 11B, an isotropic etch such as a wet chemical etch leaves the oxide under photoresist 64 with straight sides due to the faster etch rate near the top surface of oxide 62 as shown in FIG. 12B. Thereafter, as shown in FIG. 13A or alternatively in FIG. 13B, an anisotropic etch removes the exposed silicon nitride layer 60, and a first Boron implant forms P-regions 66, similar to the process in copending application Ser. No. 09/544,730. The Boron dose is on the order of $1.5-5.5$ $E12/cm^2$ with an energy of 40–80 KeV. P-regions 66 help define the channel region and separate the top source/drain region (yet to be formed) from the N– epitaxial layer 22.

Figure 14A:
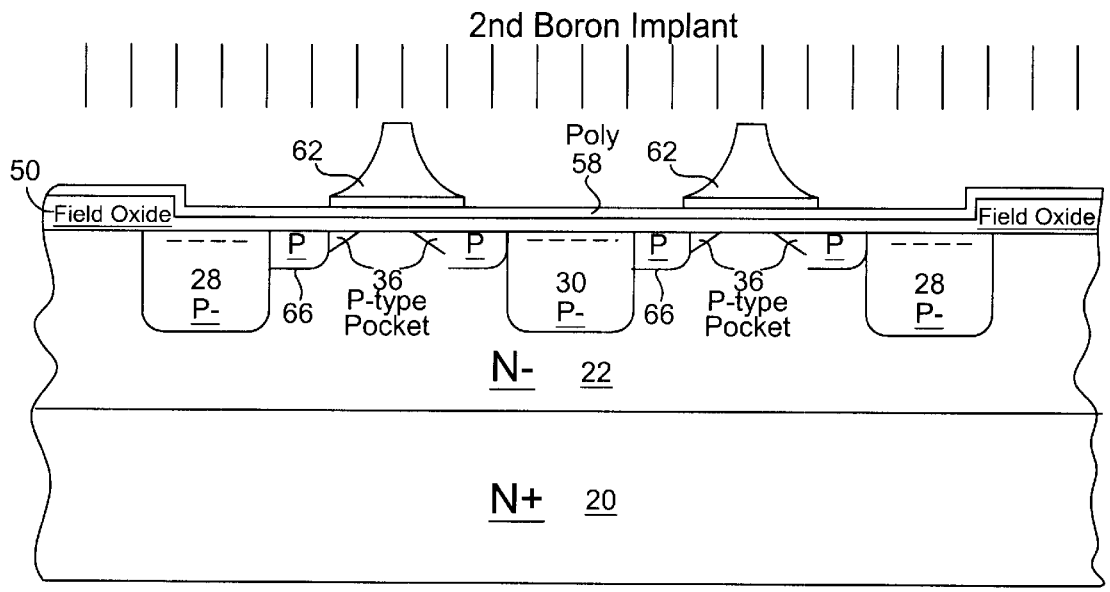
Figure 14B:
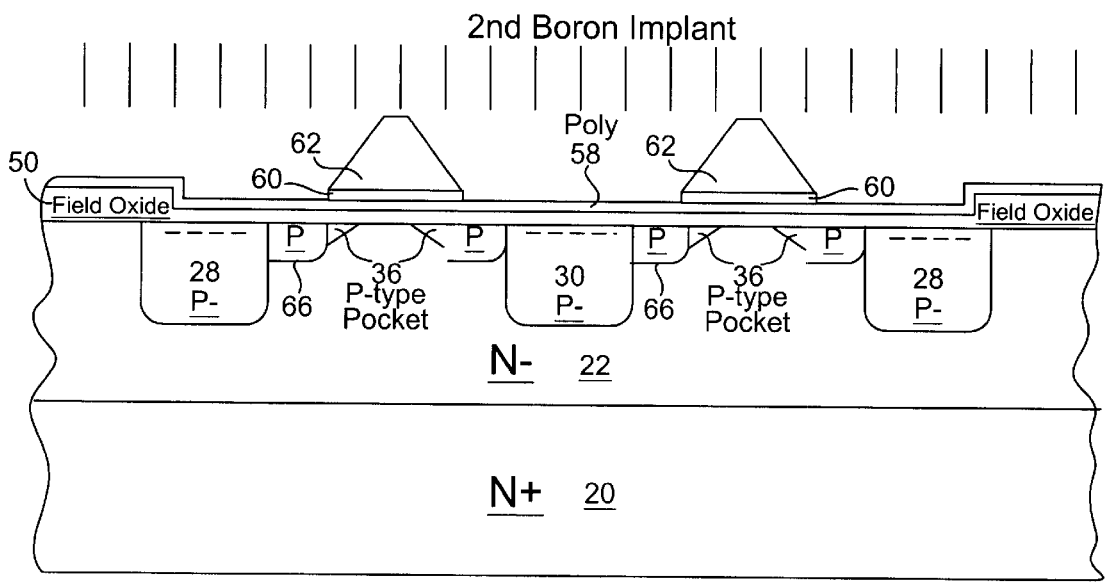
Figure 15:
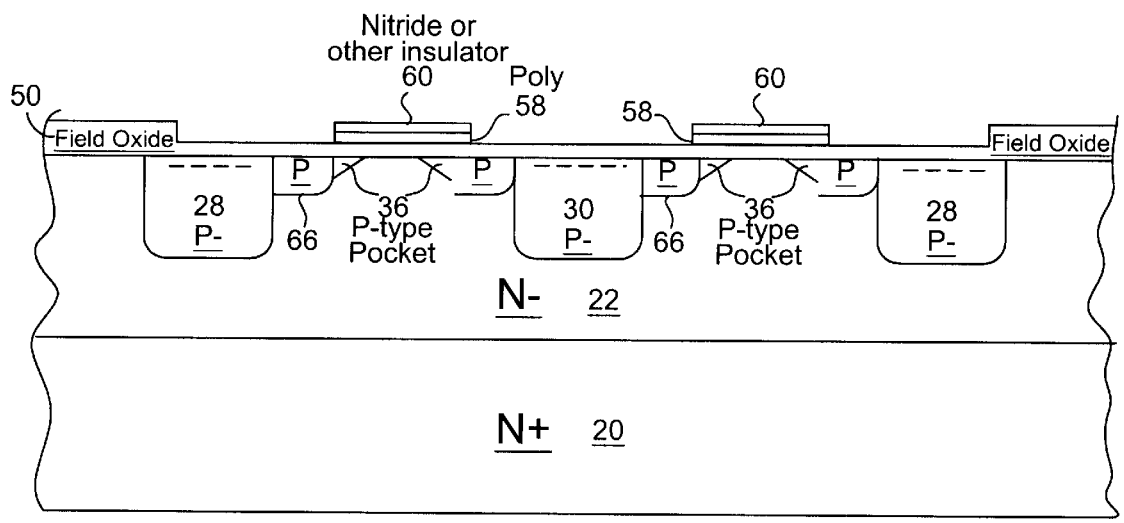

Thereafter, as shown in FIG. 14A, photoresist 64 is removed and a second Boron implant is made at a dose of $1.0-2.5$ $E12/cm^2$ at an energy of 20–60 KeV to create the lateral graded P-type pockets 36. The graded pockets are the result of ions being implanted through polysilicon 62 at acute angles with respect to the inclined curved or straight surfaces of polysilicon 62 as shown in FIGS. 14A, 14B. Thereafter, as shown in FIG. 15, a wet oxide etch followed by an anisotropic polysilicon etch removes oxide 62 and exposed polysilicon 58 using the silicon nitride layer as an etchant mask for the remaining gate oxide 58.

Next, as shown in FIG. 16, nitride layer 60 is removed by selective etch and an arsenic implant is made with a dose of $1.0-5.0$ $E13/cm^2$ at an energy of 20–60 KeV to form the N-doped source/drain regions 24 in the surface of P-regions 66. With this dose, the arsenic surface concentration in the guard ring 28 and plug regions 30 is much lower than the original Boron surface concentration. Therefore, this arsenic implant will not have any significant effect on the Boron surface concentration in the guard ring or plug areas. However, an additional photoresist pattern can be used to cover the guard ring and plug areas if necessary prior to the arsenic implant. Rapid thermal annealing is then used to activate the arsenic. If an oxide spacer is desired around the edge of the polysilicon gate 26, 5–35 nm of silicon oxide is deposited and then anisotropically etched to remove the oxide from the top surface of gates 26 while keeping the oxide around the periphery of the gate 26. The use of oxide spacers is optional and can be skipped. Finally, as shown in FIG. 4, the top electrode 32 and bottom electrode 34 are formed on the top and bottom surfaces of the device with rapid thermal annealing employed to form good ohmic contacts if necessary. The electrodes are preferably formed from Ti, TiN, Ni, Ag, Au, Cu, Al, or combinations of two or more of these materials.

The power rectifier device in accordance with the invention employing a graded lateral P-N junction between the channel region and the underlying source/drain region improves device operating characteristics and can be readily fabricated using conventional semiconductor processing steps including photoresist masking, plasma etching, and ion implantation in forming the guard ring, conductor plugs, source/drain regions, the graded channel regions, and the gate electrodes overlying device channel regions. The use of a sloped ion implant mask obviates the need for spacers in accurately separating the implanted dopant concentrations and permits the fabrication of shorter channels. Precise control of surface dopant concentration peaks is realized, and modification of the B body profile reduces any parasitic JFET action.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. In the fabrication of a vertical silicon semiconductor rectifier device in which a top electrode is connected to a bottom electrode through a channel region underlying a gate, a method of fabricating the channel in the semiconductor comprising the steps of:
   a) forming a partial ion mask on a surface of the semiconductor, the mask having a sloped surface which varies the path length of ions passing through the mask, and
   b) implanting ions through the mask into a channel region in the semiconductor to form a channel region with laterally graded dopant concentration and a laterally graded P-N junction.

2. The method as defined by claim 1 and further including the step of:
   c) forming a gate over the channel region, the gate being capable of voltage bias for altering the conduction of carriers through the channel.

3. A method of fabricating a silicon semiconductor rectifier device comprising the steps of:
   a) providing a semiconductor substrate of a first conductivity type and having opposing major surfaces,
   b) forming a first silicon oxide layer on a first major surface,
   c) forming a polysilicon layer over the first silicon oxide layer,
   d) forming a second silicon oxide layer over the polysilicon layer,
   e) selectively masking and etching the second silicon oxide layer to form silicon oxide ion masks with sloped surfaces which vary the path lengths of ions through the masks,
   f) forming source/drain doped regions of the first conductivity type in the first surface adjacent to the silicon oxide ion masks,
   g) implanting ions through the sloped surfaces of the silicon oxide ion masks into channel regions and thereby forming laterally graded channel regions of a second conductivity type in the first region and abutting the source/drain doped regions, and
   h) selectively etching the polysilicon layer to form gates overlying the laterally graded channel regions.

4. The method as defined by claim 3 where in step e) includes isotropically etching the second silicon oxide layer whereby the masked second silicon oxide layer is laterally etched.

5. The method as defined by claim 4 wherein the second silicon oxide layer surface is damaged prior to isotropic etching whereby the etch rate is faster near the surface.

6. The method as defined by claim 4 and further including the step of forming an insulator layer such as silicon nitride over the polysilicon layer to prevent etching of the polysilicon layer during step e).

7. The method as defined by claim 3 wherein step f) includes doping the first surface region using the gates as self-aligned masks.

8. The method as defined by claim 3 and further including the step of forming a guard ring with dopants of a second conductivity type in the first major surface around a device region in which the rectifier device is fabricated.

9. The method as defined by claim 8 and further including the step of forming at least one plug in the device region with dopants of the second conductivity type, the plug forming a P-N junction with the substrate.

10. The method as defined by claim 9 wherein the guard ring and the plug are formed in the same step.

11. The method as defined by claim 10 and further including the steps of forming a top electrode on the first major surface contacting the guard ring, plug, source/drain regions, and gates, and forming a bottom electrode on the second major surface of the semiconductor substrate.

12. The method as defined by claim 11 wherein the semiconductor substrate includes an epitaxial layer formed on a semiconductor body.

13. The method as defined by claim 12 wherein the epitaxial layer and semiconductor body are N-doped, and the guard ring and plug are P-doped.

14. The method as defined by claim 3 and further including the steps of forming a top electrode on the first major surface contacting the source/drain regions and the gates, and forming a bottom electrode on the second major surface.

15. The method as defined by claim 14 wherein the semiconductor substrate includes an epitaxial layer formed on a semiconductor body.

16. In the fabrication of a vertical semiconductor rectifier device in which a top electrode is connected to a bottom electrode through a channel region underlying a gate, a method of fabricating the channel in the semiconductor comprising the steps of:
   a) forming a partial ion mask of varying thickness on a surface of the semiconductor, the mask having a sloped mask surface for receiving ions, and
   b) implanting ions through the mask at an acute angle to the sloped mask surface into a channel region to form a laterally graded channel region in the semiconductor.

17. The method as defined by claim 16 wherein the sloped mask surface is curved.

18. The method as defined by claim 16 wherein the sloped mask surface is straight.

* * * * *